United States Patent
Tseng et al.

[11] Patent Number: 5,899,741
[45] Date of Patent: May 4, 1999

[54] METHOD OF MANUFACTURING LOW RESISTANCE AND LOW JUNCTION LEAKAGE CONTACT

[75] Inventors: Fouriers Tseng, Hsin-Chu; Peng-Cheng Chou, Taipei, both of Taiwan

[73] Assignee: Taiwan Semiconductor Manufacturing Company Ltd., Hsin-Chu, Taiwan

[21] Appl. No.: 09/040,432

[22] Filed: Mar. 18, 1998

[51] Int. Cl.[6] .............................................. H01L 21/4763
[52] U.S. Cl. ............................................ 438/649; 438/630
[58] Field of Search ................................. 438/625, 643, 438/649, 648, 655, 656, 663

[56] References Cited

U.S. PATENT DOCUMENTS

| | | | |
|---|---|---|---|
| 5,397,742 | 3/1995 | Kim | 437/190 |
| 5,427,981 | 6/1995 | Choi | 437/195 |
| 5,510,296 | 4/1996 | Yen et al. | 437/200 |
| 5,668,065 | 9/1997 | Lin | 438/303 |
| 5,700,716 | 12/1997 | Sharan et al. | 437/190 |

*Primary Examiner*—Joni Chang
*Attorney, Agent, or Firm*—George O. Saile; Stephanie B. Ackerman; Rosemary L. S. Pike

[57] ABSTRACT

A new method of forming an amorphous silicon glue layer in the formation of a contact is described. Semiconductor device structures are provided in and on a semiconductor substrate. An insulating layer is deposited overlying the semiconductor device structures. An opening is etched through the insulating layer to contact one of the semiconductor device structures. An amorphous silicon layer is deposited overlying the insulating layer and within the opening. Ions are implanted into the amorphous silicon layer whereby grain sizes within the amorphous silicon layer are reduced. Native oxide on the surface of the amorphous silicon layer is removed. A titanium/titanium nitride layer is deposited overlying the amorphous silicon layer. A metal layer is deposited overlying the titanium/titanium nitride layer and filling the opening. The substrate is annealed whereby the titanium layer reacts with the amorphous silicon layer and the silicon semiconductor substrate to form titanium silicide. The metal layer is etched back or patterned to complete metallization in the fabrication of an integrated circuit device.

28 Claims, 5 Drawing Sheets

METHOD OF MANUFACTURING LOW RESISTANCE AND LOW JUNCTION LEAKAGE CONTACT

BACKGROUND OF THE INVENTION

1. Field of the Invention

The invention relates to a method of contact formation in the fabrication of integrated circuits, and more particularly, to a method of forming an amorphous silicon glue layer for improved contact formation in the manufacture of integrated circuits.

2. Description of the Prior Art

In a common application for integrated circuit fabrication, a contact opening is etched through an insulating layer to an underlying conductive area to which electrical contact is to be made. A glue layer, typically titanium, is conformally deposited within the contact opening. Next, a titanium nitride barrier layer is formed within the contact opening. A conducting layer material is deposited within the contact opening. Typically, tungsten is deposited and etched back to form a plug filling the contact opening. After tungsten deposition, the wafer is subjected to annealing whereby the titanium glue layer reacts with the silicon substrate to form titanium silicide. Silicon is lost from the substrate both during etching and in the reaction with the titanium layer. As the design rules continue to shrink, contact depth becomes more shallow. It is difficult to decrease the depth of the titanium silicide region. This may lead to the penetration of the junction layer by the titanium silicide region causing junction leakage. Increased contact resistance is also a concern.

U.S. Pat. No. 5,510,296 to Yen et al teaches a method of contact formation including an amorphous silicon glue layer and a deposited tungsten silicide layer to complete the contact which is subjected to a high flow rate nitrogen annealing to provide a contact with low contact resistance. U.S. Pat. No. 5,397,742 to Kim a titanium and titanium nitride barrier layer followed by the deposition of titanium and polysilicon layers which are annealed to form titanium silicide. A tungsten plug is then formed within the contact opening. U.S. Pat. No. 5,427,981 to Choi teaches the formation of a polysilicon and photoresist layer at the bottom of a contact opening. Titanium is deposited and annealed to react with the polysilicon layer to form titanium silicide. Tungsten is deposited over the titanium silicide layer at the bottom of the contact opening.

SUMMARY OF THE INVENTION

A principal object of the present invention is to provide an effective and very manufacturable method of reducing contact resistance and junction leakage in the fabrication of integrated circuit devices.

Another object of the invention is to provide a method for forming an amorphous silicon glue layer that will reduce junction leakage in the fabrication of an integrated circuit device.

A further object of the invention is to provide a method for forming an amorphous silicon glue layer with a pre-amphorization implant to both reduce contact resistance and reduce junction leakage.

In accordance with the objects of this invention a new method of forming an amorphous silicon glue layer in the formation of a contact is achieved. Semiconductor device structures are provided in and on a semiconductor substrate. An insulating layer is deposited overlying the semiconductor device structures. An opening is etched through the insulating layer to contact one of the semiconductor device structures. An amorphous silicon layer is deposited overlying the insulating layer and within the opening. Ions are implanted into the amorphous silicon layer whereby grain sizes within the amorphous silicon layer are reduced. Native oxide on the surface of the amorphous silicon layer is removed. A titanium layer is deposited overlying the amorphous silicon layer. A metal layer is deposited overlying the titanium layer and filling the opening. The substrate is annealed whereby the titanium layer reacts with the amorphous silicon layer and the silicon semiconductor substrate to form titanium silicide. The metal layer is etched back or patterned to complete metallization in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
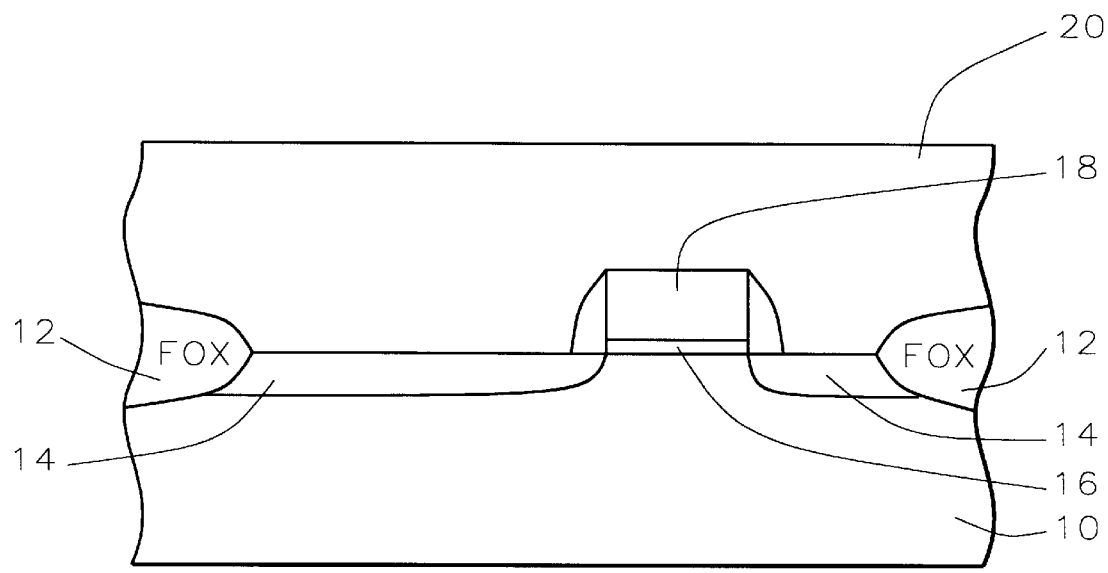
FIGS. 1 through 10 schematically illustrate in cross-sectional representation a preferred embodiment of the present invention.

Referring now more particularly to FIG. 1, there is illustrated a portion of a partially completed integrated circuit device. There is shown a semiconductor substrate 10, preferably composed of monocrystalline silicon. Semiconductor device structures are formed in and on the semiconductor substrate. For example, source/drain regions 14 are formed as is understood in the art either before or after formation of the gate electrode 18 overlying gate silicon oxide layer 16. Field OXide regions 12 separate the semiconductor device structures from other such structures, not shown.

An insulating layer 20, composed of borophosphosilicate glass (BPSG), borosilicate glass (BSG), phosphosilicate glass (PSG), silicon dioxide, or the like, is deposited over the surface of the semiconductor structures to a thickness of between about 5000 to 9000 Angstroms and preferably planarized.

Figure 2:
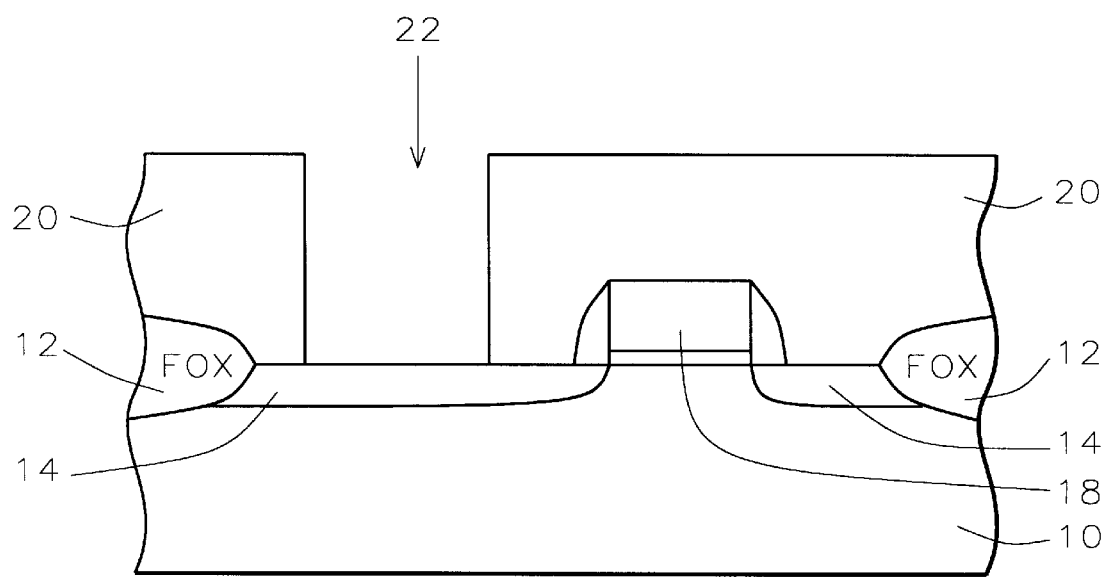

Referring now to FIG. 2, a contact opening 22 is etched through the insulating layer 20 to the source/drain region 14 within the semiconductor substrate. The contact opening is not drawn to scale, but is enlarged to show detail. Typically, a hydrofluoric acid (HF) vapor clean is performed to remove the native oxide formed on the contact surface.

Figure 3:
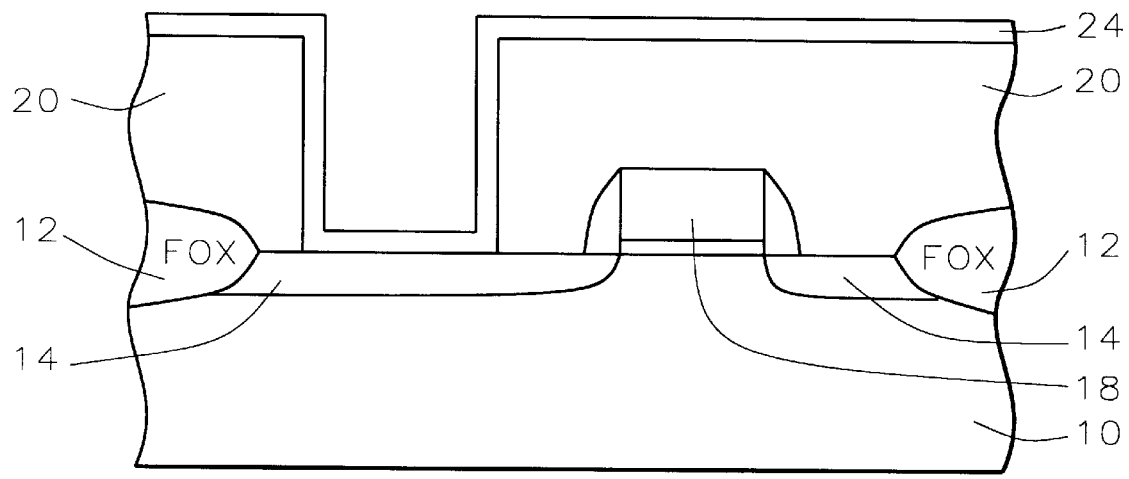

Referring now to FIG. 3, the novel amorphous silicon glue layer of the present invention will be described. A layer of amorphous silicon 24 is deposited conformally over the surface of the insulating layer 20 and within the contact opening to a thickness of between about 200 and 400 Angstroms. The amorphous silicon layer is deposited by chemical vapor deposition at a temperature of between about 500 to 550° C.

Figure 4:
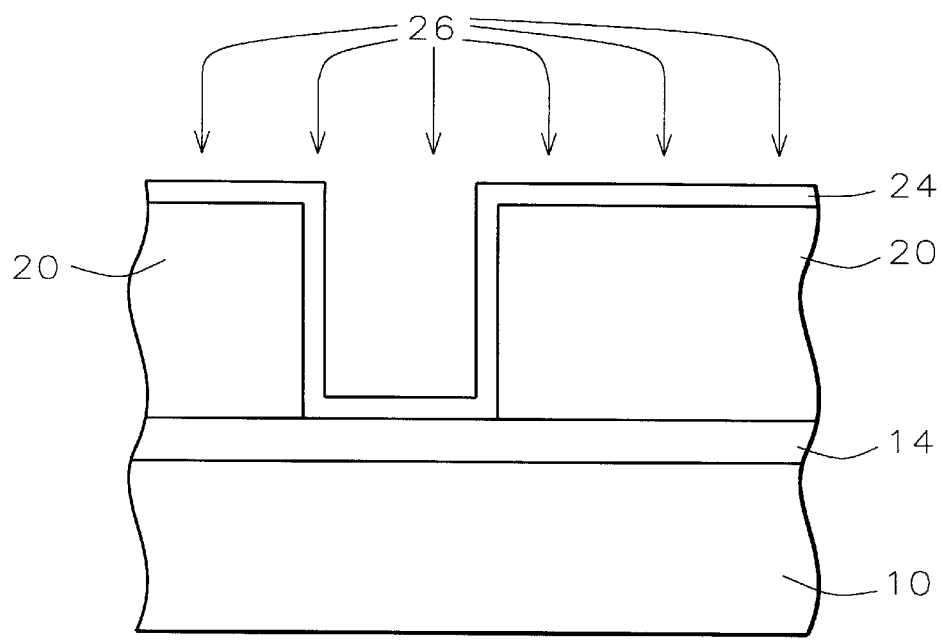

FIGS. 4 through 8 will show only the contact area of the integrated circuit device. Referring now to FIG. 4, a pre-amphorization implant (PAI) 26 is performed which will decrease the silicon grain size in the amorphous silicon layer 24. The grain size is reduced to less than about 0.2 microns. Arsenic, argon, or $SiF_2$ ions are implanted into the amorphous silicon layer 24 at an energy of between about 20 and 40 KeV with a dosage of between about 1E12 and 1E13 atoms/cm$^2$. This ion implantation is for bombardment only, not a high enough dosage for real doping purposes. The reduction of the silicon grain size will improve the uniformity of the titanium silicide layer to be formed at the bottom of the contact opening, and thus, will reduce leakage and contact resistance.

Next, a HF vapor clean is performed to remove native oxide buildup on the amorphous silicon surface.

Figure 5:
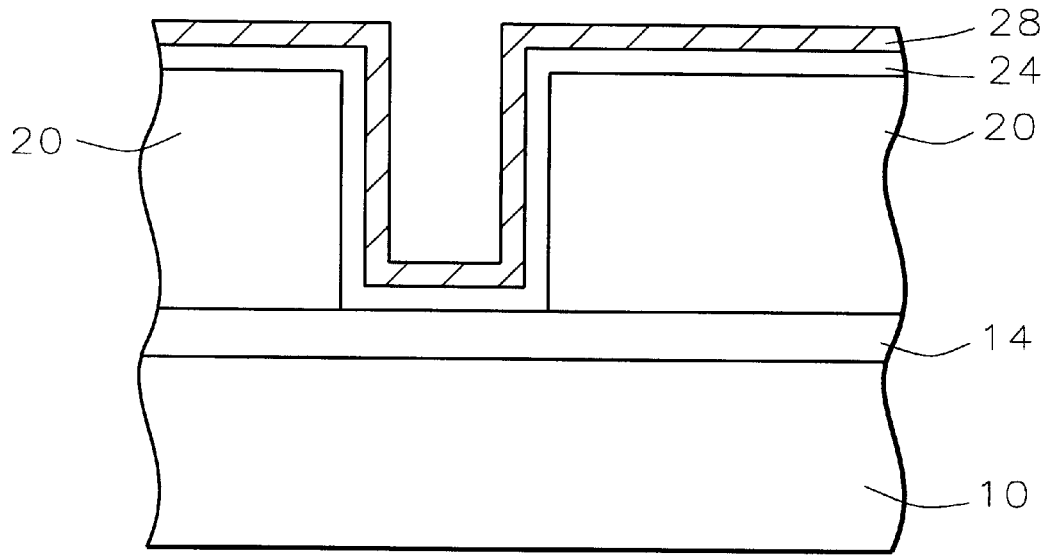

A titanium glue layer 28 is deposited conformally over the surface of the amorphous silicon layer 24 to a thickness of between about 300 and 450 Angstroms, as illustrated in FIG. 5.

Figure 6:
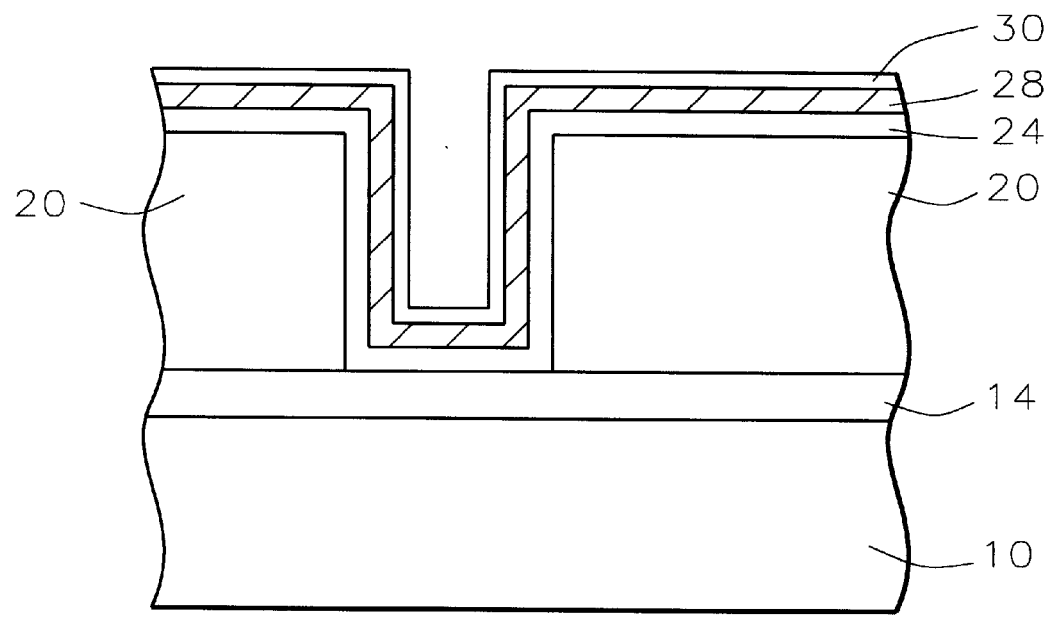

Next, referring to FIG. 6, a layer of titanium nitride 30 is deposited by chemical vapor deposition (CVD) over the titanium layer 28 and within the contact opening to a thickness of between about 200 and 400 Angstroms.

Figure 7:
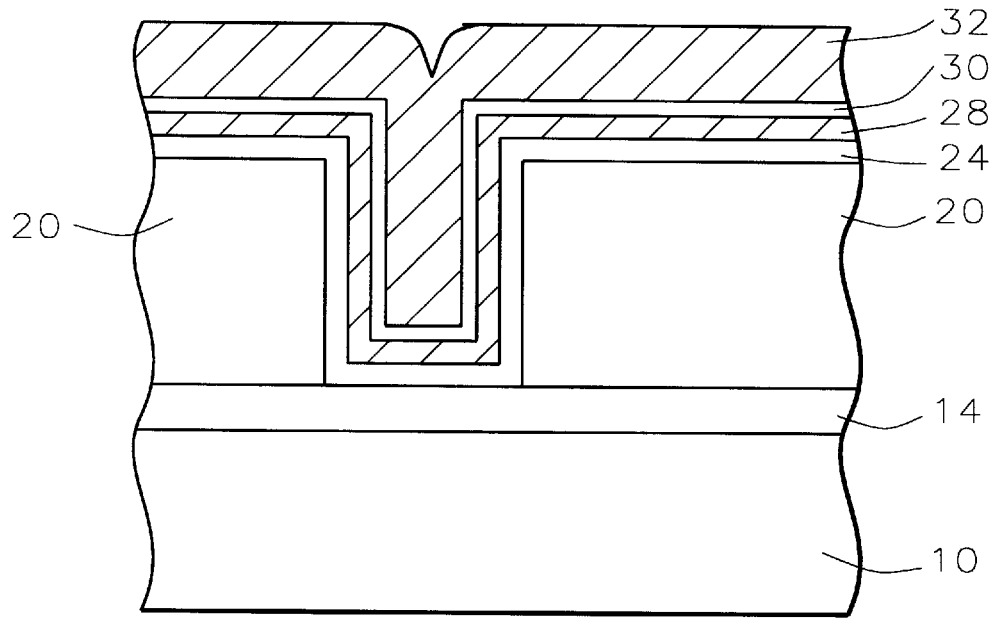

A layer of tungsten 32 is deposited by low pressure chemical vapor deposition (LPCVD) over the barrier layer 30 to fill the contact opening, as shown in FIG. 7.

Figure 8:
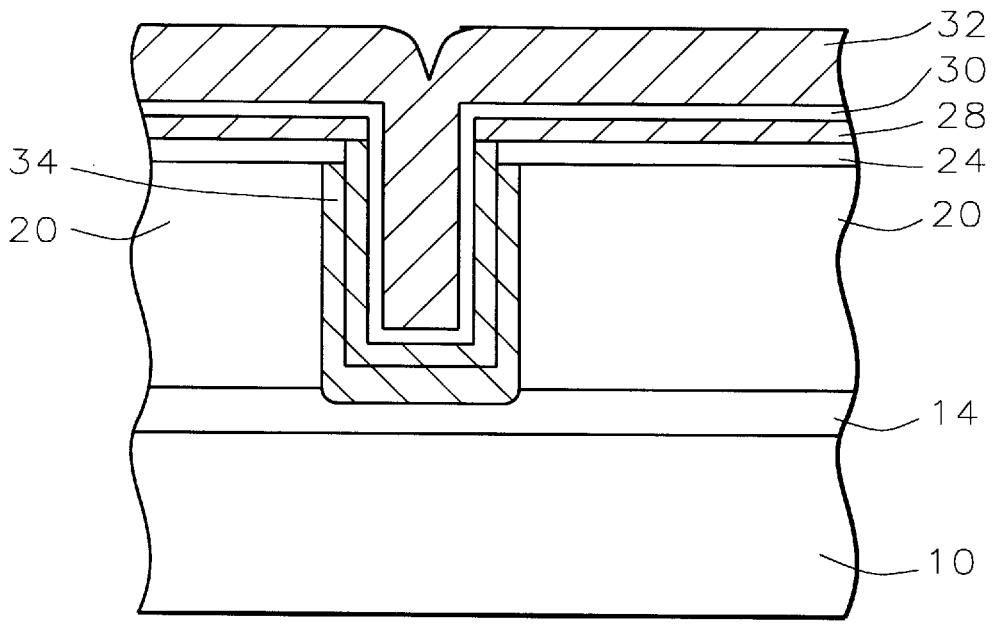

Referring now to FIG. 8, a rapid thermal annealing (RTA) step is performed to form titanium silicide region 34. The RTA is performed by flowing $N_2$ gas at a temperature of between about 650 and 850° C. for a duration of between about 20 and 120 seconds. The titanium layer 28 reacts with the amorphous silicon layer 24 to form titanium silicide. Because of the presence of the amorphous silicon layer 24, only a small portion of the silicon substrate at the bottom of the contact opening reacts with the titanium to form titanium silicide. This reduces contact resistance. Since the titanium silicide region 34 is shallow, it does not penetrate the junction 14, so junction leakage is also reduced. The thickness of the amorphous silicon layer 24 can be adjusted so that titanium silicide can be formed in the amorphous silicon layer and in the silicon substrate at the same time.

Figure 9:
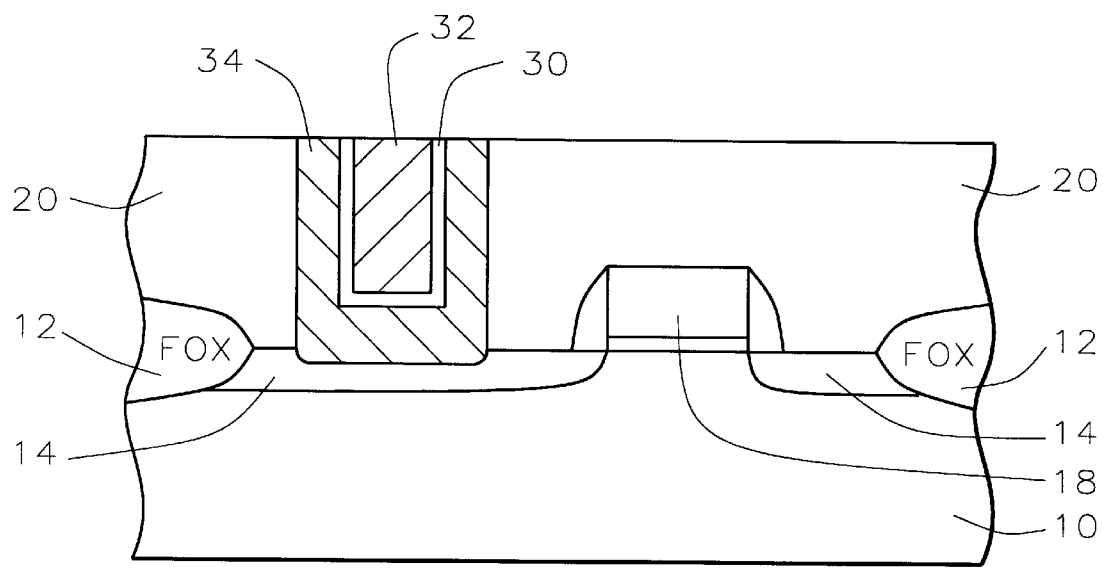

Referring now to FIG. 9, the tungsten is etched back to leave a tungsten plug filling the contact opening. Alternately, a tungsten line could be defined.

Figure 10:
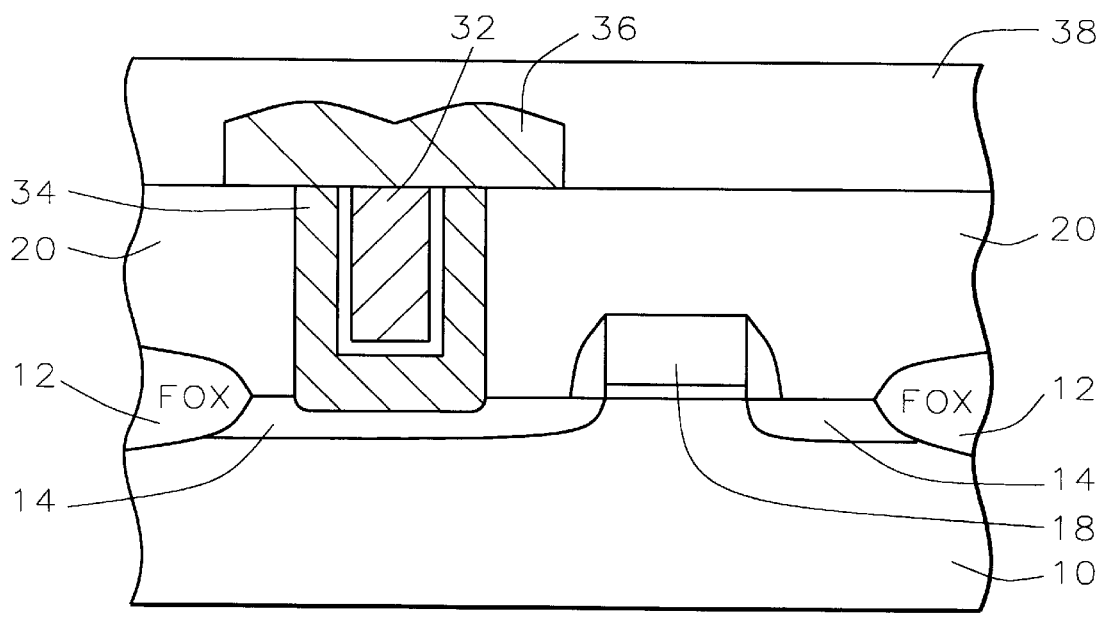

Processing continues as is conventional in the art with metal deposition and patterning. For example, FIG. 10 shows a patterned metal layer 36, such as aluminum and an intermetal dielectric layer 38. Further levels of tungsten plugs and metallization can be fabricated using the process of the present invention.

The process of the invention results in both reduced contact resistance and reduced junction leakage. An amorphous polysilicon layer is deposited first within the contact opening. The pre-amphorization ion implant and HF vapor clean are key to reducing contact resistance. The presence of the amorphous silicon layer in the formation of the titanium silicide layer prevents too much of the silicon substrate from reacting with the titanium, thus reducing junction leakage.

While the invention has been particularly shown and described with reference to the preferred embodiments thereof, it will be understood by those skilled in the art that various changes in form and details may be made without departing from the spirit and scope of the invention.

What is claimed is:

1. A method of metallization in a fabrication of an integrated circuit device comprising:

providing semiconductor device structures in and on a silicon semiconductor substrate;

depositing an insulating layer overlying said semiconductor device structures;

etching an opening through said insulating layer to contact one of said semiconductor device structures;

depositing an amorphous silicon layer overlying said insulating layer and within said opening;

implanting ions into said amorphous silicon layer whereby grain sizes within said amorphous silicon layer are reduced;

thereafter removing native oxide on the surface of said amorphous silicon layer;

thereafter depositing a titanium layer overlying said amorphous silicon layer;

depositing a metal layer overlying said titanium layer and filling said opening;

thereafter annealing said substrate whereby said titanium layer reacts with said amorphous silicon layer and said silicon semiconductor substrate to form titanium silicide; and etching back said metal layer to leave said metal layer only within said opening to complete said metallization in the fabrication of said integrated circuit device.

2. The method according to claim 1 wherein said semiconductor device structures include gate electrodes and source/drain regions and wherein said one of said semiconductor device structures contacted is a source/drain region.

3. The method according to claim 1 wherein said amorphous silicon layer is deposited by chemical vapor deposition and has a thickness of between about 200 and 400 Angstroms.

4. The method according to claim 1 wherein said step of implanting ions into said amorphous silicon layer is performed at an energy of between about 20 and 40 KeV with a dosage of between about 1E12 and 1E13 atoms/$cm^2$.

5. The method according to claim 1 wherein said ions are arsenic ions.

6. The method according to claim 1 wherein said ions are argon ions.

7. The method according to claim 1 wherein said ions are $SiF_2$ ions.

8. The method according to claim 1 wherein said step of removing said native oxide is performed by a hydrofluoric acid (HF) vapor clean.

9. The method according to claim 1 wherein said titanium layer has a thickness of between about 300 and 450 Angstroms.

10. The method according to claim 1 further comprising depositing a titanium nitride layer having a thickness of between about 200 and 400 Angstroms overlying said titanium layer.

11. The method according to claim 1 wherein said annealing is a rapid thermal annealing performed by flowing nitrogen gas at a temperature of between about 650 and 850° C. for a duration of between about 20 to 120 seconds.

12. The method according to claim 1 wherein said metal layer comprises tungsten.

13. A method of metallization in a fabrication of an integrated circuit device comprising:

providing semiconductor device structures in and on a silicon semiconductor substrate;

depositing an insulating layer overlying said semiconductor device structures;

etching an opening through said insulating layer to contact one of said semiconductor device structures;

depositing an amorphous silicon layer overlying said insulating layer and within said opening;

implanting ions into said amorphous silicon layer whereby grain sizes within said amorphous silicon layer are reduced;

thereafter removing native oxide on a surface of said amorphous silicon layer;

thereafter depositing a titanium layer overlying said amorphous silicon layer;

depositing a titanium nitride barrier layer overlying said titanium layer;

depositing a tungsten layer overlying said barrier layer and filling said opening;

annealing said substrate whereby said titanium layer reacts with said amorphous silicon layer and said silicon semiconductor substrate to form titanium silicide;

etching back said tungsten layer to leave said tungsten layer only within said opening; and depositing a metal layer overlying said tungsten layer and patterning said metal layer to complete said metallization in the fabrication of said integrated circuit device.

14. The method according to claim 13 wherein said semiconductor device structures include gate electrodes and source/drain regions and wherein said one of said semiconductor device structures contacted is a source/drain region.

15. The method according to claim 13 wherein said amorphous silicon layer is deposited by chemical vapor deposition and has a thickness of between about 200 and 400 Angstroms.

16. The method according to claim 13 wherein said step of implanting ions into said amorphous silicon layer is performed at an energy of between about 20 and 40 KeV with a dosage of between about 1E12 and 1E13 atoms/cm$^2$.

17. The method according to claim 13 wherein said ions are chosen from the group containing arsenic, argon, and $SiF_2$ ions.

18. The method according to claim 13 wherein said step of removing said native oxide is performed by a hydrofluoric acid (HF) vapor clean.

19. The method according to claim 13 wherein said titanium layer has a thickness of between about 300 and 450 Angstroms.

20. The method according to claim 13 wherein said titanium nitride layer has a thickness of between about 200 and 400 Angstroms overlying said titanium layer.

21. The method according to claim 13 wherein said annealing is a rapid thermal annealing performed by flowing nitrogen gas at a temperature of between about 650 and 850° C. for a duration of between about 20 to 120 seconds.

22. A method of forming a contact having reduced resistance and reduced junction leakage in a fabrication of an integrated circuit device comprising:

providing semiconductor device structures including gate electrodes and source/drain regions in and on a silicon semiconductor substrate;

depositing an insulating layer overlying said semiconductor device structures;

etching an opening through said insulating layer to contact one of said source/drain regions;

depositing an amorphous silicon layer overlying said insulating layer and within said opening;

implanting ions into said amorphous silicon layer whereby grain sizes within said amorphous silicon layer are reduced and whereby contact resistance is reduced;

thereafter cleaning said amorphous silicon layer with hydrofluoric acid vapor to remove native oxide on a surface of said amorphous silicon layer;

thereafter depositing a titanium layer overlying said amorphous silicon layer;

depositing a titanium nitride barrier layer overlying said titanium layer;

depositing a tungsten layer overlying said barrier layer and filling said opening;

annealing said substrate whereby said titanium layer reacts with said amorphous silicon layer and said silicon semiconductor substrate to form titanium silicide and wherein said amorphous silicon layer prevents penetration of said one of said source/drain regions by said titanium silicide and thereby reduces junction leakage; and patterning said tungsten layer to complete said formation of said contact having reduced resistance and reduced junction leakage metallization in the fabrication of said integrated circuit device.

23. The method according to claim 22 wherein said amorphous silicon layer is deposited by chemical vapor deposition and has a thickness of between about 200 and 400 Angstroms.

24. The method according to claim 22 wherein said step of implanting ions into said amorphous silicon layer is performed at an energy of between about 20 and 40 KeV with a dosage of between about 1E12 and 1E13 atoms/cm$^2$.

25. The method according to claim 22 wherein said ions are chosen from the group containing arsenic, argon, and $SiF_2$ ions.

26. The method according to claim 22 wherein said titanium layer has a thickness of between about 300 and 450 Angstroms.

27. The method according to claim 22 wherein said titanium nitride layer has a thickness of between about 200 and 400 Angstroms overlying said titanium layer.

28. The method according to claim 22 wherein said annealing is a rapid thermal annealing performed by flowing nitrogen gas at a temperature of between about 650 and 850° C. for a duration of between about 20 to 120 seconds.

* * * * *